United States Patent [19]

Kanda et al.

[11] Patent Number: 4,657,825
[45] Date of Patent: Apr. 14, 1987

[54] ELECTRONIC COMPONENT USING A SILICON CARBIDE SUBSTRATE AND A METHOD OF MAKING IT

[75] Inventors: Atsushi Kanda; Shunichi Takagi; Rokuro Kambe, all of Aichi, Japan

[73] Assignee: NGK Spark Plug Co., Ltd., Aichi, Japan

[21] Appl. No.: 812,634

[22] Filed: Dec. 23, 1985

[30] Foreign Application Priority Data

Dec. 24, 1984 [JP] Japan .................................. 59-272397
Dec. 24, 1984 [JP] Japan .................................. 59-272398

[51] Int. Cl.$^4$ ............................................. B32B 15/04
[52] U.S. Cl. .................................... 428/627; 428/641; 428/660; 428/661; 428/663; 428/671; 428/672; 428/673; 428/670; 427/255.7; 427/383.3; 427/404

[58] Field of Search ............... 428/627, 641, 660, 661, 428/663, 671, 672, 673, 938; 427/404, 405, 255.7, 380, 295, 250, 383.3, 383.7; 204/192 C, 40

[56] References Cited

U.S. PATENT DOCUMENTS 4,025,947  5/1977  Gernitis et al. .................. 428/663
4,293,619 10/1981  Landingham et al. ............. 428/627
4,532,190  7/1985  Kambe et al. ..................... 428/627
4,567,110  1/1986  Jarvinen ............................ 428/627

Primary Examiner—L. Dewayne Rutledge
Assistant Examiner—John J. Zimmerman
Attorney, Agent, or Firm—Finnegan, Henderson, Farabow, Garrett & Dunner

[57] ABSTRACT

The bond strength between a silicon carbide substrate and a metal layer comprised of a series of metal films is improved without detrimentally affecting other properties of such a device by interposing a layer of silicon, $Si_2Mo$ or mixtures thereof between the substrate and the first metal film in the layer which is preferably Ti, Zr or Hf.

16 Claims, No Drawings

ELECTRONIC COMPONENT USING A SILICON CARBIDE SUBSTRATE AND A METHOD OF MAKING IT

BACKGROUND OF THE INVENTION

The present invention relates to an electrical device having a substrate of sintered silicon carbide on which a metal film is formed for use in electronic equipment such as substrates for wiring and wave absorbers.

Sintered compacts of silicon carbide are known to be superior for use under severe conditions as they have excellent properties including corrosion-resistance, high thermal conductivity, low thermal expansivity and resistance to thermal shock. However, because the impact resistance of such a sintered compact is lower than that of metal, it is often reinforced with a metal layer which may be formed of a plurality of metal films. For example, one or more than one metal film may be formed into a metal layer on the surface of a ceramic substrate through the high melting point metal technique (known as the Telefunken Method), activated metal method, physical evaporation or plating. Japanese Patent No. 59-57976 discloses "Ceramics Having Laminated Metal Film" invented by the present inventors. In addition, published Japanese Patent Application No. 59-57973 discloses a "Metal-Ceramic Composite Material." According to these references, metals selected from the groups IV B, VI B and IB of elements are applied on the surface of ceramic materials in a predetermined order through physical evaporation or plating to form ceramics having a laminated metal film thereon.

Conventional metal films formed on the surfaces of sintered compacts of silicon carbide by means of the high melting point metal method contain only a small amount of oxide for forming a reaction phase within the silicon carbide. A metal film formed by means of activated metal method allows carbon to be liberated through a eutectic reaction of the activated metal with the silicon in the silicon carbide. A metal film formed by means of the physical evaporation method allows the carbon to be liberated with the thermal expansive reaction. Consequently, when the metal film is formed by plating simultaneously with at least two of the aforementioned methods, the adhesion of the metal is not sufficient for the reasons described in reference to the aforementioned three methods.

The present invention is intended to solve the adhesion problem. It is, therefore, an object of the invention to provide a sintered substrate of silicon carbide having a metal film strongly bonded to the substrate. It is an additional object of the invention to provide a method of forming a device having a sintered silicon carbide substrate with a film of metal strongly bonded to the substrate.

SUMMARY OF THE INVENTION

In order to achieve these objects and other objects of the invention, there is provided an electronic device that has a sintered substrate consisting essentially of silicon carbide with an intermediate layer that consists essentially of a material selected from the group consisting of silicon, molybdenum disilicide and mixtures thereof. The material comprising the intermediate layer is applied to the surface of the substrate and a metal layer is applied to the surface of the intermediate layer. Preferably, the metal layer applied to the intermediate layer includes a metal film with the metal film consisting essentially of a metal selected from the group consisting of titanium, zirconium and hafnium. It is further preferred that an additional metal film be applied over the titanium, zirconium or hafnium film, the additional film being comprised of a metal selected from the group consisting of chromium, molybdenum and tungsten. Two other layers can preferably be applied over the chromium, molybdenum or tungsten layer. Such materials would consist either of a metal selected from the group VIII elements of the Periodic Table, which in turn would be covered by a film of copper, silver and gold or the chromium, molybdenum and tungsten layer would be covered directly with the layer of copper, silver or gold.

The method embodiment of the present invention is comprised of a method of forming an electronic device which is comprised of a substrate consisting essentially of silicon carbide with at least one electrically conductive metal layer formed thereon. The method steps of the present invention comprise first applying an intermediate layer to a surface of the silicon carbide substrate. The intermediate layer consists essentially of a material selected from the group consisting of silicon, molybdenum disilicide and mixtures thereof. Next, a first metal film is applied to the surface of the intermediate layer, the first metal film consisting essentially of a metal selected from the group consisting of titanium, zirconium and hafnium. Next, a second metal film is applied to the surface of the first metal film. The second metal film consists essentially of a metal selected from the group consisting of chromium, molybdenum and tungsten. Optionally, a third metal film can be formed on the second metal film with a third metal film consisting essentially of a metal selected from group VIII of the Periodic Table. An outer metal film consisting essentially of a metal selected from the group consisting of copper, silver and gold is applied to the previously applied film to form the outer most layer of the device. Finally, an electrically conductive member is joined to the outer layer with the electrically conductive member consisting essentially of a metal selected from the group consisting of copper, silver, gold and platinum.

The present invention will now be disclosed in terms of preferred embodiments.

DESCRIPTION OF THE PREFERRED EMBODIMENTS

In order to provide an electrical device comprised of a sintered silicon carbide substrate and a layer of metal adhered thereto whereby the metal layer is strongly bonded to the substrate there is provided an intermediate layer of silicon, molybdenum disilicide ($Si_2Mo$) or mixtures thereof.

When such a device is formed or used at high temperatures, metal adjacent the sintered substrate diffuses into the substrate and reacts with the silicon carbide to liberate carbon. In the present invention, the carbon reacts with the silicon in the intermediate layer to produce silicon carbide. Consequently, the liberated carbon is not allowed to remain and, because the silicon carbide produced by reaction with the carbon is the same composition as that of the sintered substrate, the metal film applied to the intermediate layer is strongly bonded. When the intermediate layer is composed of molybdenum disilicide, a similar effect is obtained because of the activity of the silicon in the molybdenum disilicide. The improved bonding will be insignificant if the intermediate layer is 500 Å or thinner and no improvement will be obtained when it is 5000 Å or thicker.

The metal layer applied to the intermediate layer preferably is comprised of a plurality of metal layers. The first metal layer adjacent the intermediate layer is comprised of a metal selected from the group IV B elements (i.e., Ti, Zr and Hf). A second metal layer is applied to the first and the second layer is comprised of a metal selected from the group VI B elements (i.e., Cr, Mo and W). A top metal layer is applied to the second layer and the top layer is comprised of a metal selected from the group IB of elements (i.e., Cu, Ag and Au). A copper, gold, silver or platinum member may be joined onto the surface of the top metal layer.

Another means for solving such problems is implemented by providing a device having a sintered silicon carbide substrate and an intermediate layer in the same manner as that of the first means, except that a third layer is comprised of a metal selected from group VIII elements (i.e., Fe, Co, Ni, Ru, Rh, Pd, Os, Ir and Pt), is interposed between the second and top metal layers.

The group IV B elements in the first metal layer are highly active and readily react with nitrogen and oxygen contained in SiC to form a second intermediate layer of nitride or oxide. Consequently, the first metal layer acts to strongly bond to the SiC. In the group IV B elements, titanium and zirconium are especially preferred for use as the first metal layer because of their adhesion. Thickness of the first metal layer is normally in the range from 500 to 5000 Å and preferably 1000 to 2000 Å to improve the resistance to thermal shock. If the thickness of the first metal layer is less than 500 Å, the forces generated by the difference in thermal expansion between SiC and the metal member joined to the other layers or the top layer will not be relieved, thus reducing the adhesion. On the other hand, if the thickness exceeds 5000 Å, the difference in thermal expansion between the first metal layer and SiC will significantly reduce the adhesion.

The group VI B of elements intended for the second metal layer have coefficients of thermal expansion in the 5.5 to $8.4 \times 10^{-6}$/°C. range, which is relatively close to that of SiC in the 2.9 to $12 \times 10^{-6}$ range. Thus, they not only work as a thermal shock cushioning medium but also supplement the adhesion of the first metal layer with their activity. When a copper, gold, silver or platinum member is soldered with eutectic silver at high temperatures, moreover, the first metal layer acts as a partition effective in preventing the thermal diffusion of the IB group of elements constituting the top layer of the metal film according to one embodiment or the VIII group of elements constituting the third layer thereof in the second embodiment from extending up to the first metal layer and thus decreasing its adhesion.

The description of the aforementioned intermediate layer and the first and second metal layers is common to the first and second embodiments.

The top layer, comprised of the group IB elements according to the first embodiment, offers excellent ductility and functions to ease the difference in the coefficient of thermal expansion between the top layer and the copper, gold, silver or platinum member joined thereto. The thicker the top layer, the better and it is preferably 1 um or greater. However, the thickness is dependent on the shape of each device and it should be in proportion to the difference in the coefficient of thermal expansion between the top layer and the copper, gold, silver or platinum member, so that the capability of absorbing deformation caused by the difference therebetween is improved. Although chemical plating methods such as electroplating and electroless plating may be used in addition to physical evaporation method to form the top layer, the physical evaporation method is preferred in view of its effect on the adhesion of the top layer to the second metal layer.

With respect to the third metal layer comprised of the group VIII elements in the second embodiment, this layer can perform a function to improve wettability with brazing silver when the copper, gold, silver or platinum member is joined thereto. The thickness of the third metal layer is normally set at 500 to 5000 Å and preferably 1000 to 2000 Å in order to prevent reduction in adhesion because of the difference in the coefficient of thermal expansion between this and the other layers. If the thickness is less than 500 Å, the wettability will deteriorate, whereas the adhesion thereof will sharply decrease if it exceeds 5000 Å.

The third metal layer is designed to prevent the second metal layer comprised of the group VI B elements from oxidizing and thus becoming brittle when the upper layer, that is, the top layer composed of the group IB of elements is formed through the chemical plating method.

As for the copper, gold, silver or platinum member joined onto the top layer of the metal film, only one face touching the top layer should be coated with copper, gold, silver or platinum. Materials usable include, for instance, copper/invar/copper clads that are coated with copper, gold, silver or platinum; metals plated with these same metals; copper, gold, silver or platinum wire rods; and copper, gold, silver or platinum plates. When the copper, gold, silver or platinum member is employed as a cushioning medium for joining other members, its thickness should be at least 0.01 mm. Brazing and thermal contact bonding are used to join the copper, gold, silver or platinum member to the top layer.

In a device constructed according to the first embodiment, the metal film and the copper, gold, silver or platinum member are strongly bonded to ceramics to make the device durable as it can not only absorb the deformation resulted from the difference in the coefficient of thermal expansion caused by severe thermal shock and but also maintain greater adhesion.

The same effect is also achieved in the case of the second embodiment and, since a layer comprised of the group VIII elements is present in the metal layers, the wettability of the copper, gold, silver or platinum member by brazing is improved to ensure higher adhesion, whereas the oxidation of the third layer at the time of chemical plating is prevented, so that the adhesion is further enhanced.

EXAMPLES OF TABLE I

The silicon carbide devices numbered 1–17 in Table I were prepared from silicon carbide substrates 10×10×5t (mm) having a composition of 94% by weight of SiC, 5.5% by weight of carbon and 0.5% by weight of boron. The substrates were finished by grinding and cleaned with neutral detergent and pure water, then in acetone by ultrasonic cleaning before being dried. The sintered silicon carbide substrates thus processed were placed in a vacuum metallizer (Model FBV-60H of Nippon Vacuum Engineering Co.) to melt-deposit metal films on the main faces of the substrate using electron beams at an internal pressure of $10^{-6}$ Torr and a temperature of 300° C. Each film is comprised of the metal noted for the first, second, third and fourth metal layers shown in Table I.

For the purpose of comparison, a sintered silicon carbide substrate having a metal film melt-deposited without providing the primary metal layer (the intermediate layer containing silicon) is set out as sample 18.

Silver lumps 10×10×5t (mm) in dimension were bonded with silver solder 0.03 (mm) thick onto the surfaces of the top layers of the metal films. The silver lumps were fixed with jigs and force was applied to the films to assess the adhesion of the metal films of the samples 1–18. Force was applied to the laminated metal film to measure the shear strength of the metal film. Some of the substrates and metal films were separately heat-treated at 600° C. for 2 hours and again subjected to measurement of shear strength. In Table I, there are shown the average of three measurements of shear strength. Before heat treatment is noted as (1) and heat-treated (2).

As shown in Table I, the samples 1–17 having a laminated metal film according to the present invention proved superior in adhesion and durability to the comparative sample 18.

EXAMPLES OF TABLE II

The silicon carbide devices numbered 1–13 in Table II were prepared in the same size and from the same composition as was used in the samples of Table I. They were ground and cleaned in the same manner as those of Table I. The sintered substrates of SiC thus processed were placed in a vacuum metallizer (Model FBV-60H of Nippon Vacuum Engineering Co.) to melt-deposit metal films shown in Table II using electron beams at an internal pressure of $10^{-6}$ Torr and 300° C. and then copper members having various thicknesses were soldered with silver to the metal films at 850° C. in an atmosphere of hydrogen.

Nickel plates 10×10×5t (mm) in dimension were bonded with silver solder (0.03) (mm) thick onto the surfaces of the copper members and the nickel plates were fixed with jigs to assess the adhesion of the junction materials by applying force from the sides of the sintered composites of SiC to measure the shear strength. In Table II, there are shown the averaged results of three measurements of shear strength. Before heat treatment is noted as (1) and after the heat treatment as (2).

As shown in Table II, the samples 1–10 according to the present invention proved superior in adhesion and durability to comparative samples 11–13.

TABLE I

| Sintered composite of SiC w. laminated metal film | Primary metal layer | Metal film 1st layer | 2nd layer | 3rd layer | 4th layer | Shear strength (1) × (kg/mm$^2$) | Shear strength (2) × (kg/mm$^2$) | Remarks |
| --- | --- | --- | --- | --- | --- | --- | --- | --- |
| 1 | Si 500Å | Ti 1000Å | Cr 1000Å | Cu 20000Å | — | 7.9 | 6.9 | Range of present invention |
| 2 | Si 1000Å | Ti 1000Å | Cr 1000Å | Ag 20000Å | — | 7.8 | 7.2 | |
| 3 | Si 1000Å | Ti 1000Å | Mo 1000Å | Cu 20000Å | — | 8.5 | 8.0 | |
| 4 | Si 1000Å | Ti 1000Å | Cr 1000Å | Ag 20000Å | — | 8.4 | 7.8 | |
| 5 | Si 1000Å | Ti 1000Å | U 1000Å | Cu 20000Å | — | 7.9 | 7.0 | |
| 6 | Si 1000Å | Zr 1000Å | Cr 1000Å | Cu 20000Å | — | 7.5 | 7.0 | |
| 7 | Si 3000Å | Zr 1000Å | Mo 1000Å | Cu 20000Å | — | 7.2 | 6.5 | |
| 8 | MoSi$_2$ 1000Å | Ti 1000Å | Mo 1000Å | Cu 20000Å | — | 8.2 | 7.7 | |
| 9 | MoSi$_2$ 1000Å | Ti 1000Å | U 1000Å | Cu 20000Å | — | 8.2 | 7.0 | |
| 10 | MoSi$_2$ 1000Å | Zr 1000Å | Mo 1000Å | Cu 20000Å | — | 7.9 | 7.0 | |
| 11 | Si 1000Å | Ti 1000Å | Cr 1000Å | Ni 1000Å | Cu 20000Å | 8.0 | 7.7 | |
| 12 | Si 1000Å | Ti 1000Å | Mo 1000Å | Ni 1000Å | Cu 20000Å | 8.7 | 8.3 | |
| 13 | Si 1000Å | Ti 1000Å | Mo 1000Å | Pd 1000Å | Cu 20000Å | 8.6 | 8.2 | |
| 14 | Si 1000Å | Zr 1000Å | Mo 1000Å | Ni 1000Å | Cu 20000Å | 7.4 | 7.0 | |
| 15 | MoSi$_2$ 1000Å | Ti 1000Å | Cr 1000Å | Ni 1000Å | Cu 20000Å | 7.8 | 7.6 | |
| 16 | MoSi$_2$ 1000Å | Ti 1000Å | Mo 1000Å | Ni 1000Å | Cu 20000Å | 8.3 | 7.9 | |
| 17 | MoSi$_2$ 1000Å | Zr 1000Å | Mo 1000Å | Ni 1000Å | Cu 20000Å | 7.23 | 7.0 | |
| 18 | — | Ti 1000Å | Cu 20000Å | — | — | 3.0 | 1.9 | Comparative example |

TABLE II

| Junction Material | Metal film 1st layer | 2nd layer | 3rd layer | 4th layer | Top layer | Metal member (thickness mm) | Shear strength (1) × (kg/mm$^2$) | Shear strength (2) × (kg/mm$^2$) | Remarks |
| --- | --- | --- | --- | --- | --- | --- | --- | --- | --- |
| 1 | Si | Ti | Mo | — | Cu | Cu | >8 | >7 | Range of |

TABLE II-continued

| Junction Material | Metal film | | | | | Metal member (thickness mm) | Shear strength (1) × (kg/mm²) | Shear strength (2) × (kg/mm²) | Remarks |
|---|---|---|---|---|---|---|---|---|---|
| | 1st layer | 2nd layer | 3rd layer | 4th layer | Top layer | | | | |
| 2 | Si 1000Å | Ti 1000Å | Mo 1000Å | — | Cu 20000Å | Cu 0.25 | " | " | present invention |
| 3 | Si 1000Å | Ti 1000Å | Mo 1000Å | — | Cu 20000Å | Cu 0.8 | " | " | |
| 4 | MoSi₂ 2000Å | Ti 1000Å | Mo 1000Å | — | Cu 20000Å | Cu 1.5 | " | " | |
| 5 | Si 1000Å | Ti 1000Å | Mo 1000Å | Ni 1000Å | Cu 20000Å | Cu 0.8 | " | " | |
| 6 | Si 1000Å | Ti 1000Å | Mo 1000Å | Ni 1000Å | Cu 20000Å | Cu 0.25 | " | " | |
| 7 | Si 1000Å | Ti 1000Å | Mo 1000Å | Ni 1000Å | Cu 20000Å | Cu 0.8 | " | " | |
| 8 | Si 1000Å | Ti 1000Å | Mo 1000Å | — | Cu 20000Å | Cu 1.5 | " | " | |
| 9 | Si 1000Å | Ti 1000Å | Mo 1000Å | — | Cu 20000Å | Au 0.8 | " | " | |
| 10 | Si 1000Å | Ti 1000Å | Mo 1000Å | — | Cu 20000Å | Ag 0.8 | " | " | |
| 11 | Si 1000Å | Ti 1000Å | Mo 1000Å | — | Cu 20000Å | Pt 0.8 | " | " | |
| 11 | Si 1000Å | Ti 1000Å | Mo 1000Å | — | Cu 20000Å | Fe—Ni 42% 0.8 | 2.5 | 0.4 | Comparative example |
| 12 | Si 1000Å | Ti 1000Å | Mo 1000Å | — | Cu 20000Å | KOVAR 0.8 | 5.0 | 0.6 | |
| 13 | Ti 1000Å | Cu 20000Å | — | — | — | — | 0.5 | — | |

As is evident from the examples noted above, the present invention provides a composite layered structure that is strongly bonded such that devices using the present invention may be used for long times under severe conditions. The present invention has been disclosed by means of specific embodiments, but the scope of the invention is not limited thereto. The scope of the invention is determined by the appended claims and their equivalents.

What is claimed is:

1. An electronic device comprising:
   a sintered substrate consisting essentially of silicon carbide;
   an intermediate layer consisting essentially of a material selected from the group consisting of silicon, molybdenum disilicide and mixtures thereof, said material being applied to a surface of said substrate, said intermediate layer having a thickness in the range of from about 500 Å to 5000 Å; and
   a metal layer applied to the surface of said intermediate layer.

2. The device of claim 1 wherein said metal layer applied to said intermediate layer includes a metal film applied to said intermediate layer, said metal film consisting essentially of a metal selected from the group consisting of titanium, zirconium and hafnium.

3. The device of claim 2 wherein said metal film has a thickness in the range of from 1000 to 2000 Å.

4. An electronic device comprising:
   a sintered substrate consisting essentially of silicon carbide;
   an intermediate layer consisting essentially of a material selected from the group consisting of silicon, molybdenum disilicide and mixtures thereof, said material being applied to a surface of said substrate, said intermediate layer having a thickness in the range of from about 500 Å to 5000 Å; and
   a metal layer comprised of a first metal film applied to a surface of said intermediate layer and a plurality of metal films applied in layers on said first metal film.

5. The device of claim 4 wherein said first metal film consists essentially of a metal selected from the group consisting of titanium, zirconium and hafnium.

6. The device of claim 5 wherein said first metal film has a thickness in the range of from 1000 to 2000 Å.

7. The device of claim 5 wherein said plurality of metal films applied to said first metal film comprise: a second metal film consisting essentially of a metal selected from the group consisting of chromium, molybdenum and tungsten; and a third metal film consisting essentially of a metal selected from the group consisting of copper, silver and gold.

8. The device of claim 7 wherein said metal film has a thickness greater than 1 um.

9. The device of claim 5 wherein said plurality of metal films applied to said first metal film comprise: a second metal film consisting essentially of a metal selected from the group consisting of chromium, molybdenum and tungsten; a third metal film consisting essentially of a metal selected from the group VIII elements of the Periodic Table; and a fourth metal film consisting essentially of a metal selected from the group consisting of copper, silver and gold.

10. The device of claim 9 wherein said fourth metal film has a thickness greater than 1 um.

11. The device of claim 7 further comprising a member joined onto a surface of said third metal film, said member consisting of a metal selected from the group consisting of copper, gold, silver and platinum.

12. The device of claim 11 wherein said member has a thickness greater than 0.01 mm.

13. The device of claim 9 further comprising a member joined onto a surface of said fourth metal film, said member consisting of a metal selected from the group consisting of copper, gold, silver and platinum.

14. The device of claim 13 wherein said member has a thickness greater than 0.01 mm.

15. A method of forming an electronic device comprised of a substrate consisting essentially of silicon carbide with at least one electrically conductive metal layer formed thereon, said method comprising the steps of:
- applying an intermediate layer to a surface of said silicon carbide substrate, said intermediate layer consisting essentially of a material selected from the group consisting of silicon, molybdenum disilicide and mixtures thereof, said intermediate layer having a thickness in the range of from about 500 Å to 5000 Å;
- applying a first metal film to the surface of said intermediate layer, said first metal film consisting essentially of a metal selected from the group consisting of titanium, zirconium and hafnium;
- applying a second metal film to the surface of said first metal film, said second metal film consisting essentially of a metal selected from the group consisting of chromium, molybdenum and tungsten;
- applying a third metal film to the surface of said second metal film, said third metal film consisting essentially of a metal selected from the group consisting of copper, silver and gold; and
- joining an electrically conductive member to said third metal film wherein said electrically conductive member consists essentially of a metal selected from the group consisting of copper, silver, gold and platinum.

16. A method of forming an electronic device comprised of a substrate consisting essentially of silicon carbide with at least one electrically conductive metal layer formed thereon, said method comprising the steps of:
- applying an intermediate layer to a surface of said silicon carbide substrate, said intermediate layer consisting essentially of a material selected from the group consisting of silicon, molybdenum disilicide and mixtures thereof, said intermediate layer having a thickness in the range of from about 500 Å to 5000 Å;
- applying a first metal film to the surface of said intermediate layer; said first metal film consisting essentially of a metal selected from the group consisting of titanium, zirconium and hafnium;
- applying a second metal film to the surface of said first metal film, said second metal film consisting essentially of a metal selected from the group consisting of chromium, molybdenum and tungsten;
- applying a third metal film to the surface of said second metal film, said third metal film consisting essentially of a metal selected from group VIII of the Periodic Table;
- applying a fourth metal film to the surface of said third metal film, said fourth metal film consisting essentially of a metal selected from the group consisting of copper, silver and gold; and
- joining an electrically conductive member to said fourth metal film wherein said electrically conductive member consists essentially of a metal selected from the group consisting essentially of copper, silver, gold and platinum.

* * * * *